(12) United States Patent
Han et al.

(10) Patent No.: US 7,012,809 B2
(45) Date of Patent: Mar. 14, 2006

(54) MOUNTING APPARATUS FOR CIRCUIT BOARD

(75) Inventors: Shao-Bo Han, Shenzhen (CN); Hsuan-Tsung Chen, Tu-Cheng (TW)

(73) Assignee: Hon Hai Precision Industry Co., Ltd., (TW)

( * ) Notice: Subject to any disclaimer, the term of this patent is extended or adjusted under 35 U.S.C. 154(b) by 17 days.

(21) Appl. No.: 10/952,580

(22) Filed: Sep. 28, 2004

(65) Prior Publication Data

US 2005/0111204 A1    May 26, 2005

(30) Foreign Application Priority Data

Nov. 21, 2003    (TW) .............................. 92220597 U

(51) Int. Cl.
*H05K 5/00*    (2006.01)
(52) U.S. Cl. ...................... 361/759; 361/683; 361/752
(58) Field of Classification Search .............. 174/52.1; 361/683, 752, 759; 312/223.2
See application file for complete search history.

(56) References Cited

U.S. PATENT DOCUMENTS

| | | | |
|---|---|---|---|
| 5,138,529 A | * | 8/1992 | Colton et al. ................ 361/816 |
| 5,398,156 A | * | 3/1995 | Steffes et al. ................ 361/683 |
| 5,452,184 A | * | 9/1995 | Scholder et al. ............. 361/799 |
| 5,519,169 A | * | 5/1996 | Garrett et al. ............. 174/35 R |
| 5,687,470 A | * | 11/1997 | Halttunen et al. .......... 29/592.1 |
| 5,973,926 A | * | 10/1999 | Sacherman et al. .......... 361/759 |
| 5,978,232 A | * | 11/1999 | Jo .............................. 361/796 |
| 6,233,156 B1 | * | 5/2001 | Liao ........................... 361/759 |
| 6,295,210 B1 | * | 9/2001 | Lanzone et al. ............. 361/799 |
| 2003/0168233 A1 | * | 9/2003 | Ennis et al. ................ 174/52.1 |

FOREIGN PATENT DOCUMENTS

TW                551026            9/2003

* cited by examiner

*Primary Examiner*—Hung V. Ngo
(74) *Attorney, Agent, or Firm*—Morris Manning & Martin; Tim Tingkang Xia, Esq.

(57) ABSTRACT

A mounting apparatus for a motherboard (10) defining a plurality of through holes, includes a panel (20), a support plate (30), and a clip (40) mounted on a bottom of the support plate. The panel includes a plurality of locking holes (24), a plurality of resilient fingers (26), and two protrusions (28) protruding therefrom. The support plate for positioning the motherboard thereon includes a plurality of hooks (34) extending downwardly and a plurality of conductors (50) mounted thereto. The clip defines two apertures (48). In assembly, the hooks of the support plate engage in the locking holes of the support plate, the conductors electronically contact with the resilient fingers of the panel, the protrusions of the panel engage in the apertures of clip to secure the motherboard to the panel.

19 Claims, 5 Drawing Sheets

MOUNTING APPARATUS FOR CIRCUIT BOARD

BACKGROUND OF THE INVENTION

1. Field of the Invention

The present invention relates to mounting apparatuses, and particularly to a mounting apparatus for readily and securely mounting a circuit board therein.

2. Description of the Related Art

During assembly of a typical personal computer, a motherboard must be fastened to a computer frame or chassis. The motherboard is conventionally mounted to the computer chassis using fasteners such as screws or bolts. However, when installing or removing the motherboard, using the fasteners is laborious and time-consuming. In addition, a tool such as a screwdriver or wrench is usually required. Moreover, the motherboard is prone to be damaged by possible impacts of the tool if the tool slips during manipulation of the fasteners.

Taiwan Patent Publication No. 551026 discloses a mounting apparatus for a motherboard. The motherboard is firstly secured to a support plate using fasteners such as clips. The clips engage in corresponding through holes of the support plate to secure the motherboard thereon. Then the combined motherboard and support plate is mounted to a computer chassis. A tool is not required when using the clips. However, the using of the clips increases the cost of the manufacturing. Because the clips are not conventional components, it is inconvenient to repair when clips are destroyed or missing.

Thus, an improved mounting apparatus for motherboards which overcomes the above-mentioned problems is desired.

BRIEF SUMMARY OF THE INVENTION

Accordingly, an object of the present invention is to provide a mounting apparatus for readily and securely installing and removing circuit boards to and from any equipment such as a chassis of a computer.

To achieve the above object, a mounting apparatus for a motherboard defining a plurality of through holes, includes a panel, a support plate, and a clip mounted onto a bottom of the support plate. The panel includes a plurality of locking holes, a plurality of resilient fingers, and two protrusions protruding therefrom. The support plate for positioning the motherboard thereon includes a plurality of hooks extending downwardly and a plurality of conductors mounted thereto. The clip defines two apertures. In assembly, the hooks of the support plate engage in the locking holes of the panel, and the conductors electrically contact with the resilient fingers of the panel, the protrusions of the panel engage in the apertures of clip to secure the motherboard to the panel.

Other objects, advantages and novel features of the present invention will become more apparent from the following detailed description when taken in conjunction with the accompanying drawings, in which:

DETAILED DESCRIPTION OF THE INVENTION

Figure 1:
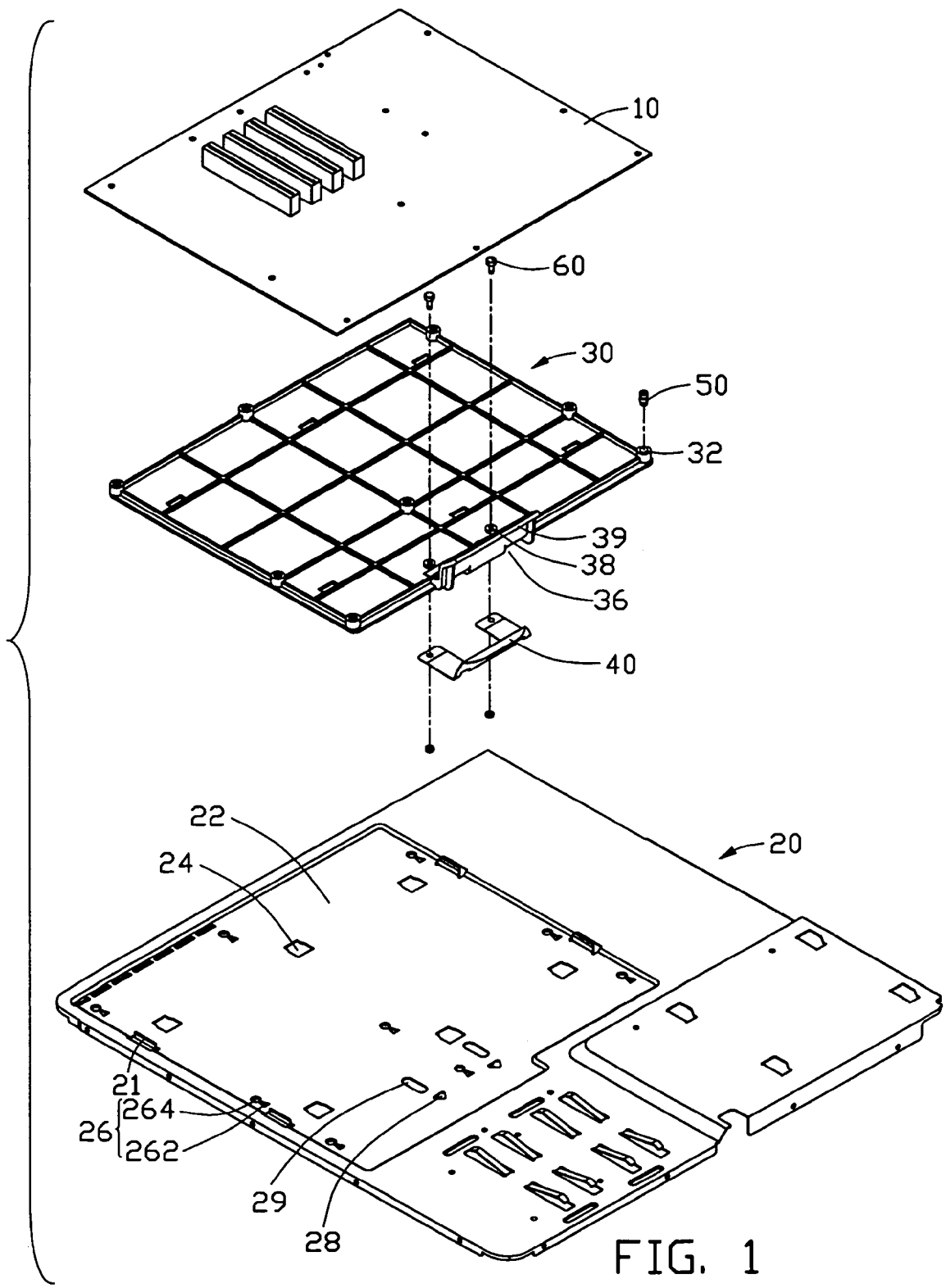
FIG. 1 is an exploded, isometric view of a motherboard mounting apparatus in accordance with the preferred embodiment of the present invention, together with a motherboard, the mounting apparatus comprising a chassis, a support plate, a plurality of conductors and a clip.

Referring to FIG. 1, a mounting apparatus in accordance with the preferred embodiment of the present invention is used to position a motherboard 10 thereon. A plurality of through holes (not labeled) is defined in the motherboard 10. The mounting apparatus comprises a chassis (a bottom panel 20 shown only) of an electronic device like a computer, a support plate 30 and a clip 40.

The bottom panel 20 defines a recess 22 by being stamped downwardly therefrom. A plurality of guiding tabs 21 is stamped upwardly and perpendicularly to the bottom panel 20 at both opposite edges of the recess 22. A plurality of spaced locking holes 24 as first complementary securing means is defined in the bottom panel 20. A plurality of resilient fingers 26 is stamped from the bottom panel 20. Each finger 26 comprises an arm 262 connecting the bottom panel 20 and a cantilever 264. A pair of protrusions 28 as second complementary securing means protrudes upwardly from a bottom of the recess 22 at one side. A pair of avoiding holes 29 is defined adjacent to the protrusions 28.

Figure 2:
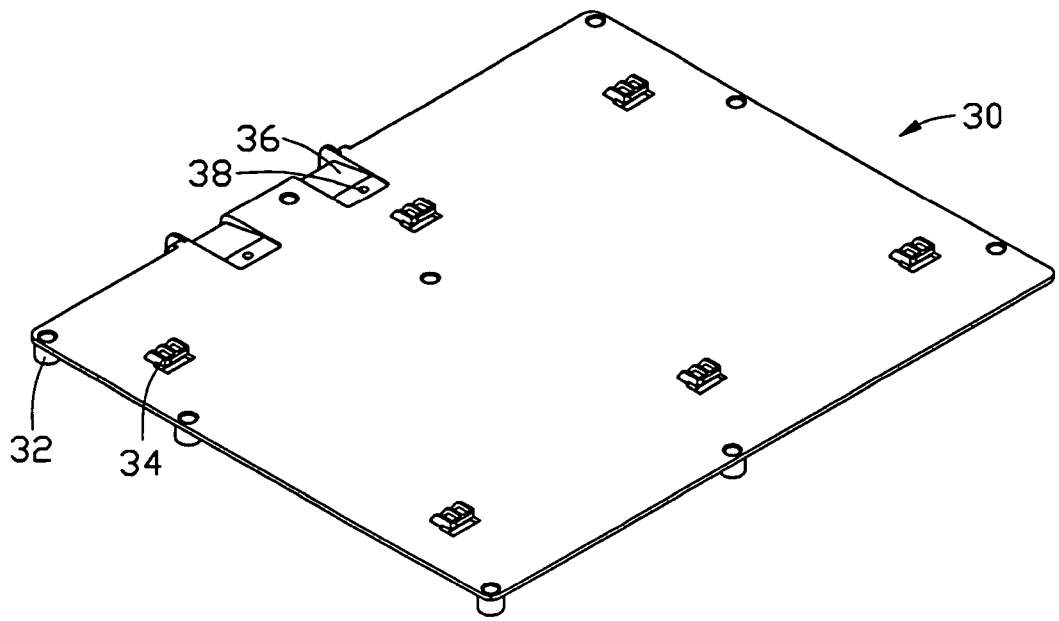
FIG. 2 is an enlarged, isometric view of the support plate of FIG. 1, but viewed from another aspect.

Referring also to FIG. 2, the support plate 30 is a plastic plate. A plurality of hollow posts 32 protrudes upwardly from the support plate 30 for receiving a plurality of conductors 50 therein, corresponding to the through holes of the motherboard 10. A plurality of L-shaped hooks 34 as first securing means extends downwardly from the support plate 30, corresponding to the locking holes 24 of the bottom panel 20. A pair of avoiding recesses 36 is defined in the bottom. A pair of screw holes 38 is defined in avoiding recesses 36. An L-shaped operation portion 39 extends upwardly from the side adjacent to the screw holes 38.

Figure 3:
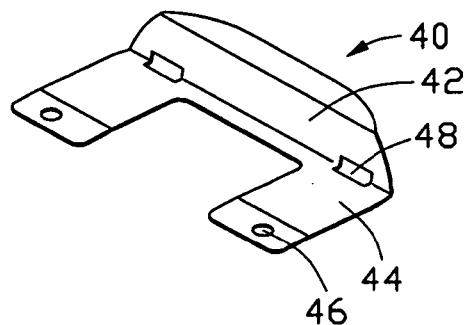
FIG. 3 is an enlarged, isometric view of the clip of FIG. 1, but viewed from another aspect.

Referring also to FIG. 3, the clip 40 as a second securing means has a generally L shape. The clip 40 comprises a handle 42 and a locking part 44. The locking part 44 comprises a pair of locking tabs (not labeled) extending vertically from both opposite ends of one side of the handle 42. An aperture 48 is defined at the junction between each locking tab and the handle 42. A hole 46 is defined in each locking tab 44 at a distal end thereof, corresponding to the screw hole 38 of the support plate 30.

Figure 4:
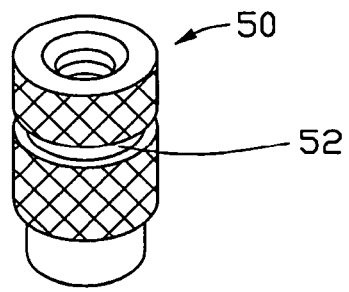
FIG. 4 is an enlarged, isometric view of one of the conductors of FIG. 1.

Referring to also FIG. 4, each conductor 50 is made of metal. The conductor 50 is a hollow column. A screw hole (not labeled) is defined in the conductor 50 from a top to a bottom. A ringed slot 52 is formed around an outer surface of the conductor. Lines are formed on the outer surface of the conductor 50.

Figure 5:
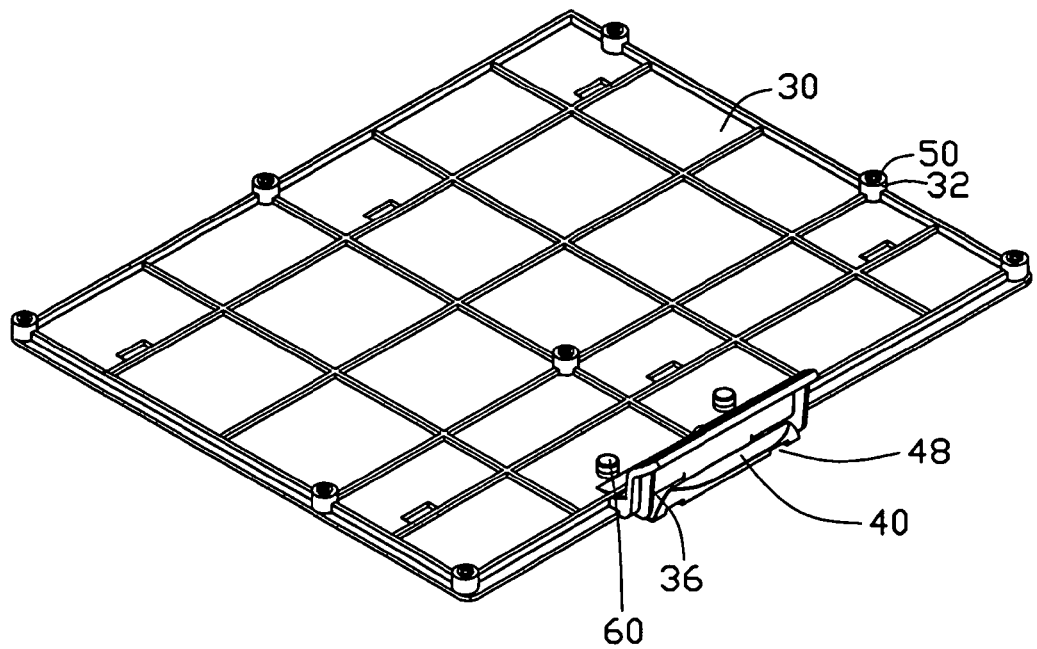
FIG. 5 is an assembled view of the support plate and the clip of FIG. 1.
Figure 6:
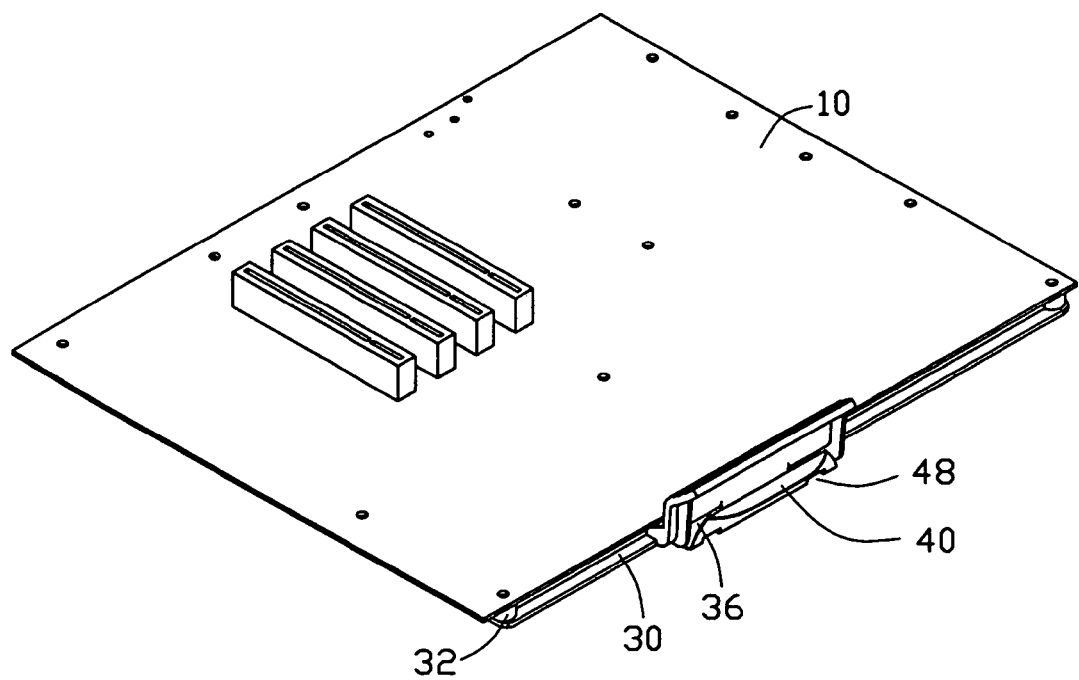
FIG. 6 is an assembled view of the support plate, the clip and the motherboard of FIG. 1.

Referring to FIGS. 5 and 6, when assembling, two screws 60 are inserted through the screw holes 38 of the support plate 30 and the holes 46 of the clip 40 to engage with two screw caps (not labeled) located below the clip 40 respectively. The clip 40 is assembled with the support plate 30. The conductors 50 are inserted into the posts 32 of the support plate 30 and are mounted therein. A plurality of screws (not shown) is inserted through the through holes of the motherboard 10 and engages in the screw hole of the connectors 50. Thus, the motherboard 10, the support plate 30 and the clip 40 are assembled together.

Figure 7:
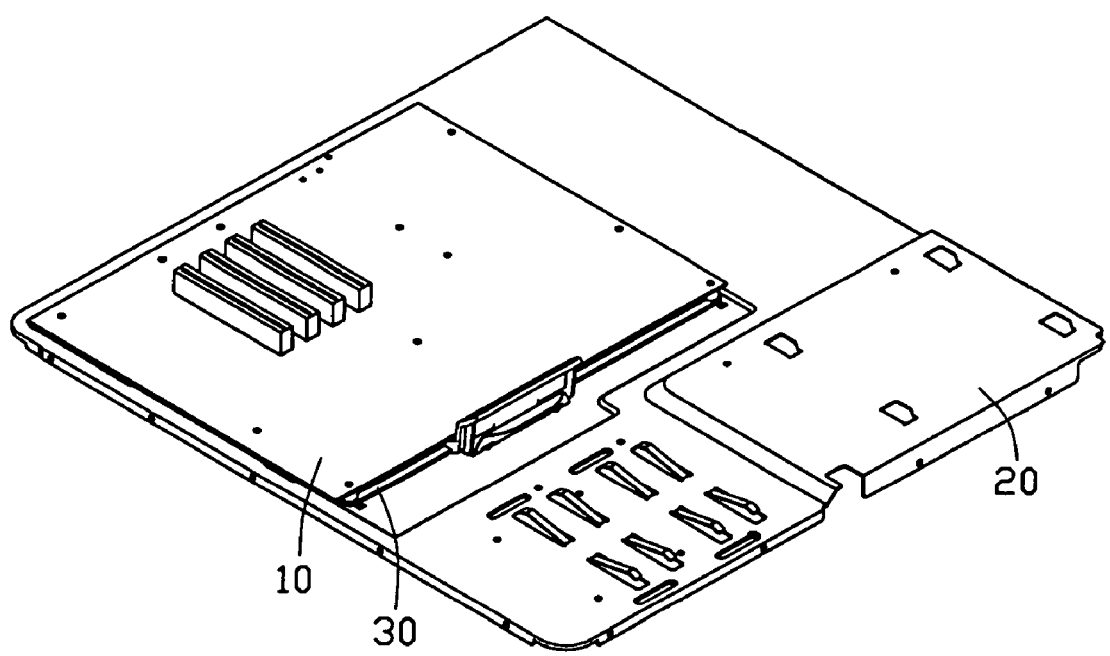
FIG. 7 is an assembled view of FIG. 1.
Figure 8:
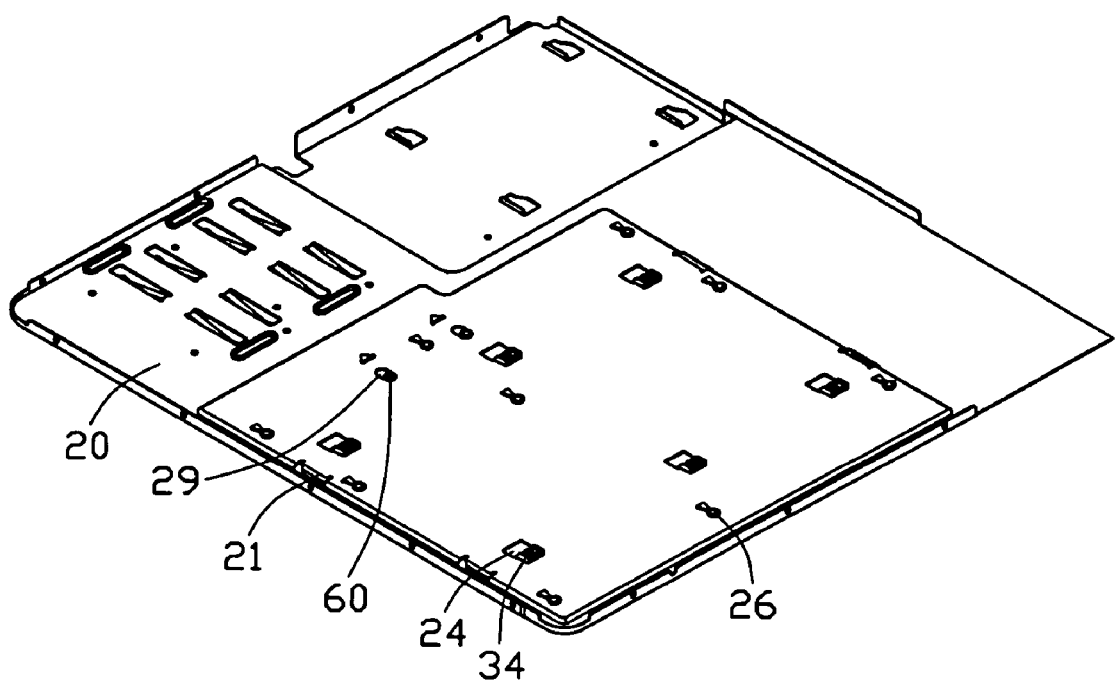
FIG. 8 is similar to FIG. 7, but viewed from another aspect.

Referring also to FIGS. 7 and 8, the combined motherboard 10, support plate 30 and clip 40 is attached to the bottom panel 20 of the chassis. The support plate 30 is pushed into the recess 22 from a front end thereof where forms the protrusions 28, and moves between the guiding tabs 21. The hooks 34 of the support plate 30 are engaged in the locking holes 24 of the bottom panel 20. Bottoms of the conductors 50 electrically contact with the ends 264 of the resilient fingers 26 of the bottom panel 20. The protrusions 28 of the bottom panel 20 engage in the apertures 48 of the clip 40 respectively. Thus, the motherboard 10 is secured to the chassis.

To remove the motherboard 10 from the chassis, the handle 42 of the clip 40 is lifted upwardly. The protrusions 28 of the bottom panel 20 are released from the apertures 48 of the clip 40. The hooks 34 of the support plate 30 are released from the locking holes 24 of the bottom panel 20 by pulling the handle 42 along the direction opposite to the above-mentioned pushing direction. The combined motherboard 10, support plate 30, clip 40 is then easily removed from the chassis.

In another embodiment, the support plate 30 can be made of metal, and the resilient fingers 26 can directly contact the support plate 30, whereby the conductors 50 can be omitted. The clip 40 can be formed directly and integrally on the support plate 30.

While the present invention has been illustrated by the description of the preferred embodiment thereof, and while the preferred embodiment has been described in considerable detail, it is not intended to restrict or in any way limit the scope of the appended claims to such detail. Additional advantages and modifications within the spirit and scope of the present invention will readily appear to those skilled in the art. Therefore, the present invention is not limited to the specific details and illustrative examples shown and described.

What is claimed is:

1. A mounting apparatus for a circuit board defining a plurality of through holes thereon, comprising:
   a panel comprising a plurality of locking holes and a plurality of resilient fingers, at least one protrusion protruding from the panel;
   a support plate adapted for positioning the circuit board thereon, the support plate comprising a plurality of hooks extending downwardly and a plurality of conductors mounted thereto; and
   a clip mounted on a bottom of the support plate for engaging with said protrusion of the panel;
   wherein the hooks of the support plate engage in the locking holes of the panel, the conductors electrically contact with the resilient fingers of the panel, said protrusion of the panel engages with the clip to secure the circuit board to the panel.

2. The mounting apparatus for a circuit board as claimed in claim 1, wherein a plurality of guiding flakes extends upwardly from both sides of the panel.

3. The mounting apparatus for a circuit board as claimed in claim 1, wherein each of the resilient fingers comprises an arm connecting the panel and a cantilever for electronically contacting with the corresponding conductor.

4. The mounting apparatus for a circuit board as claimed in claim 1, wherein the clip comprises a locking part extending slightly downwardly, and a handle extending substantially perpendicular to the locking part, said aperture is defined in a junction between the locking part and the handle.

5. The mounting apparatus for a circuit board as claimed in claim 4, wherein the locking part comprises at least one locking tab extending from a distal end thereof, a hole is defined in said locking tab, the support plate defines at least one screw hole corresponding to the hole of said locking tab for securing the clip to the support plate.

6. The mounting apparatus for a circuit board as claimed in claim 1, wherein a plurality of hollow posts extends upwardly from the support plate corresponding to the through holes of the circuit board, the conductors are received in the hollow posts, each of the conductors defines a screw hole from a top to a bottom for securing the circuit board to the support plate.

7. A mounting apparatus for a circuit board securable to a panel of an electronic device, comprising:
   a support plate adapted for said circuit board securable thereon, a plurality of first securing means formed on a side of said support plate facing said panel, and at least one second securing means attachably formed beside said side of said support plate; and
   a plurality of first complementary securing means formed on said panel facing said support plate and engagable with said first securing means along a first direction perpendicular to said panel in order to confine said support plate movable along a second direction parallel to said panel, and a second complementary securing means formed on said panel facing said support plate corresponding to said at least one second securing means and engagable with said at least one second securing means by moving one of said second complementary securing means and said at least one second securing means along said first direction in case of full engagement of said first securing means and said first complementary securing means.

8. The mounting apparatus as claimed in claim 7, wherein each of said plurality of first securing means is a hook extending toward said panel and each of said plurality of first complementary securing means is a locking hole formed on said panel.

9. The mounting apparatus as claimed in claim 8, wherein said at least one second securing means is a clip attached to an edge of said support plate beside said side thereof, and said second complementary securing means is a pair of protrusions extending toward said support plate.

10. The mounting apparatus as claimed in claim 7, wherein a plurality of guiding flakes extends toward said support plate from two opposing sides of said panel.

11. The mounting apparatus as claimed in claim 7, further comprising a plurality of resilient fingers extending from said panel toward said support plate.

12. The mounting apparatus as claimed in claim 11, wherein each of said fingers comprises an arm connecting with said panel and a cantilever for electronically contacting with a corresponding conductor formed on said support plate.

13. The mounting apparatus as claimed in claim 9, wherein said clip comprises a locking part attachably extending on said side of said support plate, and a handle extending substantially perpendicular to said locking part, and a pair of apertures is defined in a junction between said locking part and said handle to be engagble with said protrusions.

14. The mounting apparatus as claimed in claim 13, wherein said locking part comprises at least one locking tab extending from a distal end thereof, a hole is defined in said locking tab, said support plate defines at least one screw hole corresponding to said hole of said locking tab for securing said clip to said support plate.

15. The mounting apparatus as claimed in claim 12, wherein a plurality of hollow posts extends from said support plate toward said circuit board corresponding to through holes thereof, said conductor is received in each of said hollow posts respectively, said conductor defines a screw hole from a top to a bottom thereof for securing said circuit board to said support plate by means of a screw passing through said screw hole.

16. A mounting apparatus for securing a circuit board, comprising:
  an electronic-conductive panel comprising a plurality of locking holes, at least one protrusion protruding from the panel, and a plurality of resilient fingers stamped from the panel; and
  an electrically conductive support plate adapted for positioning the circuit board thereon, the support plate comprising a plurality of hooks extending downwardly therefrom, at least one aperture is defined in the support plate;
  wherein the hooks of the support plate engage in the locking holes of the support plate, said protrusion of the panel engages in said aperture of support plate to secure the circuit board to the panel, the resilient fingers electrically contact the support plate.

17. The mounting apparatus as claimed in claim 16, wherein a plurality of guiding flakes extends upwardly from both sides of the panel.

18. The mounting apparatus as claimed in claim 16, further comprising a clip, wherein the clip comprises a locking part extending slightly downwardly, and a handle extending substantially perpendicular to the locking part, said aperture is defined in a junction between the locking part and the handle.

19. The mounting apparatus as claimed in claim 18, wherein the locking part comprises at least one locking tab extending from a distal end thereof, a hole is defined in said locking tab, the support plate defines at least one screw hole corresponding to the hole of said locking tab for securing the clip to the support plate.

* * * * *